US009509249B2

(12) United States Patent
Masaryk

(10) Patent No.: US 9,509,249 B2
(45) Date of Patent: Nov. 29, 2016

(54) SYSTEM AND METHOD OF COOLING OF PHOTOVOLTAIC PANEL AND METHOD OF INSTALLATION OF SYSTEM

(71) Applicant: Michal Masaryk, Bratislava (SK)

(72) Inventor: Michal Masaryk, Bratislava (SK)

( * ) Notice: Subject to any disclaimer, the term of this patent is extended or adjusted under 35 U.S.C. 154(b) by 83 days.

(21) Appl. No.: 14/413,477

(22) PCT Filed: Jun. 5, 2013

(86) PCT No.: PCT/IB2013/054617
§ 371 (c)(1),
(2) Date: Jan. 8, 2015

(87) PCT Pub. No.: WO2013/183002
PCT Pub. Date: Dec. 12, 2013

(65) Prior Publication Data

US 2015/0155826 A1 Jun. 4, 2015

(30) Foreign Application Priority Data

Jun. 5, 2012 (SK) ............................ 50051-2012 U
Jun. 5, 2013 (SK) ............................ 50060-2013 U

(51) Int. Cl.
*H01L 31/024* (2014.01)
*H02S 40/42* (2014.01)
(Continued)

(52) U.S. Cl.
CPC .............. *H02S 40/425* (2014.12); *F16L 1/028* (2013.01); *F24J 2/04* (2013.01); *F24J 2/44* (2013.01); *F24J 3/081* (2013.01); *F28D 20/0052* (2013.01); *H01L 31/0521* (2013.01); *H02S 40/44* (2014.12); *Y02E 10/12* (2013.01); *Y02E 10/44* (2013.01); *Y02E 10/465* (2013.01); *Y02E 10/50* (2013.01); *Y02E 10/60* (2013.01); *Y02E 60/142* (2013.01); *Y02E 70/30* (2013.01)

(58) Field of Classification Search
CPC . H01L 31/0521; H02S 40/44; H02S 40/425; F24J 2/04; F24J 2/44; F24J 3/081
USPC .......................................................... 136/246
See application file for complete search history.

(56) References Cited

U.S. PATENT DOCUMENTS

2009/0152370 A1 6/2009 Pesochinsky
2010/0219637 A1 9/2010 Hovakimian

FOREIGN PATENT DOCUMENTS

CN 201074372 6/2008
DE 19604356 8/1997

(Continued)

*Primary Examiner* — Jayne Mershon

(74) *Attorney, Agent, or Firm* — Defillo & Associates, Inc; Evelyn A Defillo

(57) ABSTRACT

A heat is taken from a photovoltaic panel (1) using air that flows through the photovoltaic panel (1) unit with an air cooler (2). The unit has an air intake opening (3) and an outtake vent (4) and the air flow is enforced by a natural draft of a chimney (5), to which the photovoltaic panel (1) unit is connected to. At least a part of the chimney (5) is exposed to solar radiation. Outtake vents (4) of several photovoltaic panel (1) units can lead to one chimney (5), preferably through thermal collectors (6) and piping. The air in the chimney is warmed up by solar radiation, the air ascends towards the chimney (5) mouth and the chimney (5) natural draft created in this way enforces air flow within the photovoltaic panel (1) unit. Even the air cooler (2) of the sucked air can form part of the system—preferably in the form of a ground-coupled heat exchanger (9). The chimney (5) can be equipped with heat-absorbing surface and it can also have a supporting wind device transforming wind energy into a natural draft within the chimney (5).

22 Claims, 6 Drawing Sheets

(51) Int. Cl.

| | |
|---|---|
| ***F24J 2/04*** | (2006.01) |
| ***F24J 2/44*** | (2006.01) |
| ***F24J 3/08*** | (2006.01) |
| ***F28D 20/00*** | (2006.01) |
| ***H01L 31/052*** | (2014.01) |
| ***H02S 40/44*** | (2014.01) |
| ***F16L 1/028*** | (2006.01) |

(56) References Cited

FOREIGN PATENT DOCUMENTS

| | | |
|---|---|---|
| DE | 10207852 | 9/2002 |
| DE | 202006016108 | 2/2007 |
| DE | 102009027258 | 12/2009 |
| DE | 102010033560 | 2/2012 |
| EP | 2093808 | 8/2009 |
| EP | 2429002 | 3/2012 |
| FR | 2727790 | 6/1996 |
| FR | 2967817 | 5/2012 |
| GB | 2452754 | 3/2009 |
| KR | 20090071895 | 7/2009 |
| SK | UV5973 | 12/2011 |
| WO | WO2009111017 | 9/2009 |
| WO | WO2009124575 | 10/2009 |
| WO | WO2010000240 | 1/2010 |
| WO | WO2011009993 | 1/2011 |
| WO | WO2011011341 | 1/2011 |

SYSTEM AND METHOD OF COOLING OF PHOTOVOLTAIC PANEL AND METHOD OF INSTALLATION OF SYSTEM

CROSS REFERENCE TO RELATED APPLICATION

This application is a national stage entry of PCT/IB2013/054617 filed Jun. 5, 2013, under the International Convention claiming priority over Slovakia Patent Application No. PUV50051-2012 filed Jun. 5, 2012 and Slovakia Patent Application No. PUV50060-2013 filed Jun. 5, 2013.

FIELD OF THE INVENTION

The invention refers to a cooling system and a cooling method of a photovoltaic panel, which is being cooled in order to reach higher efficiency of its cells. The cooling system is energetically independent from the surrounding environment and the cooling effect is proportionate to the amount of incident solar radiation. The invention also describes the method of system installation.

BACKGROUND OF THE INVENTION

The efficiency of photovoltaic cells and panels, above all the ones made from silicon, depends on the temperature; specifically, with growing temperature of a photovoltaic cell its efficiency decreases. The decrease in efficiency is between 0.2% up to 0.48% per 1° C. In case of overall low efficiency of solar radiation to electric energy conversion (15-18%), the influence of temperature on the efficiency achieved is substantial. Designs of photovoltaic panel cooling are known e.g. according to DE 102006060786, which describes a usage of a heat exchanger within the unit of a photovoltaic panel. Similarly, the solution according to DE 10207852 also describes a photovoltaic panel cooling using a cooling medium and external heat exchangers. These solutions, similar to the ones mentioned in the files DE 19604356, DE 102009027258, DE 202006016108, WO 2009/111017, WO 2009/124575, CN 201074372, WO 2010/000240, EP 2093808, GB2452754 use a portable hydronic medium to conduct away heat from a photovoltaic panel; in order to operate, this kind of cooling system is supplied with outside energy. The solution according KR 20090071895, WO2011009993 uses squirting or trickling water to cool the surface of photovoltaic panels and at the same time cleans the surface of the cells. This solution is not practical due to high water consumption.

A number of inventions use heat that is conducted away from a photovoltaic panel as a special-purpose source of heat. However, this kind of configuration lays down contradictory requirements on the cell temperature. In order to obtain heat effectively it is suitable to increase the cell temperature and for the purpose of obtaining electric energy effectively it is suitable to decrease the cell and panel temperature. In case of separately standing power plants, the heat obtained from photovoltaic panels is basically unexploitable since there is no place to which the heat can be conducted to and since the sufficient amount of heat is available mainly outside the winter season.

The published solution according to SK UV 5973 uses a sorption cooling machine, which is driven by heat from a heat solar panel that is independent from a photovoltaic panel. This kind of solution brings in required effects; however, it also consists of a number of components that might require check-ups and maintenance, which along with a more complicated employment decreases economic effect.

There is a need for a solution that is simple, operable on a long term basis and that would assure heat is conducted away from a photovoltaic cell and panel unit without having any requirements on outside energy source. The new solution should be easily employed and should be maintenance free. The solution should also be applicable to the existing photovoltaic power plants.

DESCRIPTION OF THE INVENTION

The mentioned deficiencies are eliminated to a large extent by a photovoltaic panel cooling system, which takes away heat using air flowing next to a unit and/or through a unit and/or along a photovoltaic panel unit according to this invention, the subject matter of which is based on the fact that the photovoltaic panel unit contains an air cooler within a closed unit, which is adjusted to air flow and which has at least one intake opening and at least one outtake vent. The air cooler can be in the form of metal ribs or a metal surface on the rear side of photovoltaic cells. In another example the air cooler can be formed only by the rear surface of the photovoltaic cell. The closed unit that covers the cooler can be in the form of e.g. a metal case or a system of U profiles leading from bottom up, while a metal case or U profiles are attached to the rear side of the photovoltaic panel.

The air outtake vent from the unit is connected to a chimney, which creates a natural draft. For this purpose, at least one part of the chimney is exposed to solar radiation. The chimney mouth is above the level of the unit air outtake vent and the unit air outtake vent is connected to the bottom part (leading from bottom up) of the chimney in order to obtain the biggest effective height of the chimney. The air outtake vent is connected to the chimney e.g. at the height, in which the air leaves the unit through the air outtake vent.

In the presented invention, the energy necessary to enforce the flow of cool air within the unit with an air cooler, is obtained from a natural draft of a chimney i.e. we use the physical phenomenon that does not require to have any movable parts nor does it require electric energy supply nor any form of control.

It is suitable if the chimney is equipped with a surface enabling the highest heat-up of its interior by incident solar radiation. For example, the chimney can be covered with black heat-absorbing paint.

The chimney can also have a partially transparent coating in the part which is exposed to solar radiation. That being the case, the part of chimney coating not exposed to solar radiation would be non-transparent and equipped with an inside black surface. The solar radiation enters into the chimney where it falls on the dark surface and the warmed-up air ascends. A similar effect can be created by having a chimney which at least in the part with incident solar radiation has a double coating—the first coating, the outer one, is transparent and the second, inner one, is heat-absorbing. Basically by this, the chimney obtains features of a solar thermal panel, which increases the air flow within the system.

From the efficiency point of view of a design having several photovoltaic panels it would be suitable if the units containing air coolers for cooling of several panels or even several fields were interconnected into a mutual thermal collector, which leads into a mutual chimney.

The cross-section of the chimney can differ at various heights in order to optimize flow conditions e.g. the chimney can be in the shape of a rotational hyperboloid. The height of the chimney can take into account the assumed light conditions and the height of surrounding objects that shield the chimney i.e. even the photovoltaic panels themselves.

It is advantageous if proportion design principles of Itterson type cooling towers are used while designing the chimney, however it is not be necessary to create a water/air exchanger, a fact that simplifies the design of the chimney. In the same time it is not necessary to create the bottom lattice structure, on which a cooling tower usually stands, since the chimney will not suck air from its surrounding environment but only air that is brought through the pipework from the units.

When connecting several panels into one chimney, it is suitable if the collector and the connection set of individual units are optimized to reach equal air flow in panels. Then one sufficiently dimensioned chimney is located behind the photovoltaic panels and it is connected equally with all air coolers through scaled pipework and thermal collectors. The optimization of air flow equality in individual branches can be reached by suitably dimensioned cross-sections of the pipework and of the thermal collector or in later stages even by adjustable strangling elements, through which we can regulate the entire system on location and based on flow measurements. In a preferable configuration, all connections and air piping from the unit ascend or at least do not descend. In case thermal collectors or other pipework should be shielded when ascending by the panel itself, the corresponding parts of the pipework could be made from transparent material.

Balanced air flows could be reached even in a configuration in which the units are connected as exchangers in a cross register. In that kind of case one group's photovoltaic panel units are connected in their upper part to one outtake thermal collector and in their lower part to one intake thermal collector; the intake thermal collector has an air intake opening located opposite to the vent of the outtake thermal collector, through which it is connected further on to the chimney. By doing this, the length and approximately even hydraulic losses in all branches, from the intake opening of the intake thermal collector up to the mouth of the outtake vent of the outtake thermal collector, are the same for each photovoltaic unit.

When looking from the direction of incident solar radiation, a chimney is mainly located behind the panels, so that it does not shield panels themselves. Due to this fact, it is possible to build even a relatively high chimney that has a high natural draft of air.

In case the chimney is of certain height, in a situation when wind flow cannot be affected by terrain obstacles (e.g. even by the panels themselves), the chimney can have a supportive wind device changing the wind energy into a draft within the chimney. This device would preferably be in the form of a wind turbine head at the chimney mouth. This device will create additional vertical air draft out from a horizontal, even slight wind flow occurring at the chimney mouth altitude.

The presented invention is simple from a construction point of view, it does not contain any movable or wear down parts. Basically, incident solar radiation that causes photovoltaic panel to warm up, is used for cooling. This physical connection causes an increase in the cooling air flow in case of assumed increase of photovoltaic panel temperature, which eliminates the need for distinctive cooling regulation.

A chimney can be created from a plastic pipe or from a metal sheet or from other materials. A chimney may be protected against wind by supporting ropes. A simple chimney structure can have fold down joints. A joint is oriented in such a way so that when the chimney is being folded down, the falling chimney will not affect any zone with photovoltaic panels. The joints are secured by safety catches e.g. in the form of cotter. A chimney can have e.g. three joints that enable it to fold down into three quadrants (with exception to the quadrant, in which the photovoltaic panels are located). In case of excessive wind the chimney will fall down in a controlled manner to one of the three zones, in which there are no photovoltaic panels. To which zone the chimney will fall will depend on the direction of the wind. Using the joints, the chimney can be folded down to the ground when winter season arrives; when cooling is not necessary.

In order to simplify construction of larger chimneys or in order to optimize its shape, a chimney can be made from a canvas, cloth, impregnated fabric etc. The canvas is tightened around a frame made from shaped metal or plastic rods which are attached to the ground. The canvas is sewn together and tightened around a frame. The relevant parts of the canvas can be transparent in order to enable solar radiation to fall into the interior of the chimney, having a dark surface. The coating of a chimney created in this way can also be of a double or a sandwich form, by which a suitable thermal insulation of the chimney and a reinforcement of the natural draft is achieved. The chimney coating made from canvas can be pulled down for the duration of winter season. In another solution, the canvas can be tightened within the frame; in that kind of case the canvas would have supportive hoops within hems that would keep the cross-section of the chimney stable. The chimney made out of canvas also has the advantage of not damaging the photovoltaic panels by falling coating in case the chimney collapses due to wind.

A chimney from a canvas or a similar material can be built in such a way that the reinforced frame is affixed to the ground using ground screws, which does not require any concrete works. The lower part of the canvas is dug into the ground and covered by soil, which seals the coating airthigh. Within the chimney there is a gravel layer that creates a dry well for storm water that gets into the chimney through rainfall.

In a preferable configuration the closed unit in the lower part of the photovoltaic panel can be formed as a case with a parameter frame that has the same dimensions and connection elements as the photovoltaic panel itself. Then it would possible to use the same supporting structures as are used now. In the same time, in the already existing photovoltaic power plants it would be possible to attach photovoltaic panel units into the original supportive structures additionally. In one of the possible configurations, the outer, lower part of the unit can be made out of canvas, tightened around the frame. The movement of canvas in case of wind can support the movement of air in the unit. The unfastening of the canvas from the back will also enable a presumable service and cleaning of cooling surfaces in case a panel is connected to some supporting construction. The usage of canvas on the back side of the unit will decrease the material demand on modifications of original photovoltaic panels.

The invention enables to cool photovoltaic panels up to the temperature of the surrounding air. In order to increase the cooling effect, in a suitable configuration, the system can be supplemented with a sucked air cooler which would cool the air under the temperature of the surrounding environment. The air cooler is connected to the unit's air intake. The cooler can be a ground-coupled heat exchanger which consists of a pipework laid at least 1 m under the ground, preferably at least 1.5-2.5 m under the ground level. Under the term pipework it is important to understand any type of piping, pipe, tube through which air can flow. How deep the specific pipework is laid, could be specified on the basis of hydrometeorological data from the given location. In general, in case of depth that is larger than 1.5 m the ground temperature is relatively stable even in hot, summer days.

The pipework of the ground-coupled heat exchanger can be laid out even in a sinuous way directly in the ground under the photovoltaic panel holders. It can be expected that in this position the ground would warm up less since the surface would be shielded by panels holding photovoltaic panels. The pipework air intake head is located above the ground level, preferably at a place position that is shielded and it can also be equipped with an intake air filter that could be replaced easily.

A configuration using ground-coupled heat exchanger with two registers can be used in order to reach smaller pressure losses. The registers are made out of two, basically horizontal pipes that are interconnected through a set of transverse pipes usually of a smaller diameter; while the register's intake opening and the register's outtake vent are on opposite sides. In this kind of configuration, air flow is divided within a register between the set of transverse tubes, causing the air to flow more slowly with lower losses. Due to the fact that the intake opening and outtake vent of the ground-coupled heat exchanger are opposite each other, we will reach the same length and pressure losses in all possible lanes within individual transverse pipes.

Since in the ground-coupled heat exchanger water can condensate from the sucked air, the underground piping can gradiently descend to a place, where there is an opening in the piping that is connected to a small dry well. As opposed to the use of ground-coupled heat exchangers when heating air that goes to living rooms, the underground piping in this invention does not have to be limited by a requirement for elimination of possible odours.

It is also suitable if the connection between the ground-coupled heat exchanger and intake openings of photovoltaic panel units is equipped with a by-pass valve that can disconnect the ground-coupled heat exchanger—in that kind of case, the chimney would suck cooling air from its surrounding environment. The by-pass valve can be a thermostatically controlled valve. This valve enables suction of the surrounding environment air without this one being warmed-up in the ground-coupled heat exchanger—especially in case the ground temperature, especially in winter and some transient times of year is higher than the temperature of the surrounding environment. By-pass connection could be done even through a manually adjustable valve that would be switched to a suitable position at a preset interval (summer, winter) by maintenance personnel. During winter, the maintenance personnel would switch off the ground-coupled heat exchanger function.

By-pass valve can also be controlled by pressure e.g. in the form of a pressure valve. The ground-coupled heat exchanger is then disconnected in case of a low chimney draft in order not to stop air flow over the heat exchangers in panels.

The length and diameters of the pipework are dimensed so that the chimney air draft covers all pressure losses in the entire ground-coupled heat exchanger and also in other piping leading up to the chimney.

In other configuration the air cooler could be created by a pipework laid in the running water in the proximity of the panels.

An air intake opening can be equipped with an intake air filter. This one can be equipped with a cleaning element that is operated by wind and that wipes off or shakes off gathered dirt from the filter. Not only the chimney, but even the intake opening of the ground-coupled heat exchanger can be equipped with a device supporting draft from a wind. It can be in the form of a simple rotation of intake pipe fitting towards the wind direction using a lever ending in direction sign.

In the case of placing photovoltaic panels to the building roofs a cold air can be piped up towards the photovoltaic panels and the chimney can be suitably incorporated into a roof. The pressure difference and the effect of wind that depend on the building height can support the air flow. The chimney could even be created in front of the unit's intake opening provided that the air does not warm up too much not to be able to cool the photovoltaic panels. For example the chimney could be formed by a pipe attached to some building facade and its mouth could enter the unit's intake opening. However, that being the case, it would be suitable to assure protection against possible entry of too warm air from the chimney to the units, e.g. using a thermostatic valve. In another case there could be three pipes on the facade or within the building—one—exposed to solar radiation would form a chimney, the second one—shielded or insulated would form a connection between a ground exchanger and the unit's (with coolers) intake opening and the third one would form a connection to the chimney from the unit's outtake vent.

Even the photovoltaic panel cooling method, in which we warm up the air in the chimney through solar radiation is new—the air ascends towards the chimney mouth and the chimney draft that is created in this way causes air to flow within the photovoltaic panel unit. The cooling air sucked into the photovoltaic panel unit can be cooled to a temperature that is below the temperature of its environment, preferably in such a way that the air is lead through a heat exchanger placed in a ground or a water source.

According to this invention it is possible to lower the temperature of photovoltaic cell even to a temperature that is under the level of temperature of a surrounding environment while using only available thermal potentials of the nature without any demanding processing and without a complicated regulation. The maintenance of the device as described in this invention is narrowed only to the maintaining of the leak tightness of distribution system and its inner cleanliness. In case the inner distribution system is polluted with dust, it can be cleaned with compressed air or using high-pressure water cleaning.

According to a previously presented description even the system installation method is new. The subject matter of the installation method is based on the fact that in case one is building a new photovoltaic power plant, first, one places a system of pipework of cooling air heat exchanger into the ground and only subsequently the supporting structures for photovoltaic panels are mounted. Since building of a photovoltaic power plant is usually connected with a removal and disposal of arable soil, sufficient construction machines that can be used even for placement of ground-coupled heat exchanger are present at the building site.

In case of already existing photovoltaic power plants, alleys between individual fields with photovoltaic panels can be used. The alleys are sufficiently wide for the operation of grass mowing machinery. So, a groove is dug up along an alley and then a pipe or several parallel pipes of cooling air ground-coupled heat exchanger are placed into it. Depending on the plan configuration, one pipe or several pipes in the corresponding alley can be used for all the panels of the given row with a connection to a chimney, where each row of panels has its own chimney. The specific configuration of pipes and chimney or chimneys would depend on the area and shape of the estate.

In another procedure, the digging up of grooves for ground exchanger pipes can be substitutes by drilling vertical drill wells into which ground heat exchanger pipes are inserted. In case we want to use commonly available ground drills, their depth would be limited, so several drill wells would be used, e.g. in an alley there would be one drill well for each column of panels.

The presented installation process will enable to implement the system in both—new and already existing photovoltaic power plants. In case of already built power plants the subsequent process can be used. Each panel is removed from the holder and successively a unit is attached to it at its back. The unit has the same connection elements on its lower part as the panel itself, which subsequently enables to place each panel to its original place in the supportive frame. Subsequently, all intake openings and outtake vents of units are interconnected into the selected configuration.

BRIEF DESCRIPTION OF THE DRAWINGS

The invention is described in more detail in FIGS. 1 to 10. The used ratio of sizes and dimensions, numbers and quantities of panels are select with the goal of increasing the transparency of figures; the selected parameters, quantities and displayed parameter ratios cannot be understood as narrowing the extent of the required protection. The arrows represent incident solar radiation and the direction of air flow.

On the FIG. 1, there is a scheme depicting connection of the chimney and a cross-section of an air cooler with air suction from the photovoltaic panel intake opening surroundings.

Figure 3:
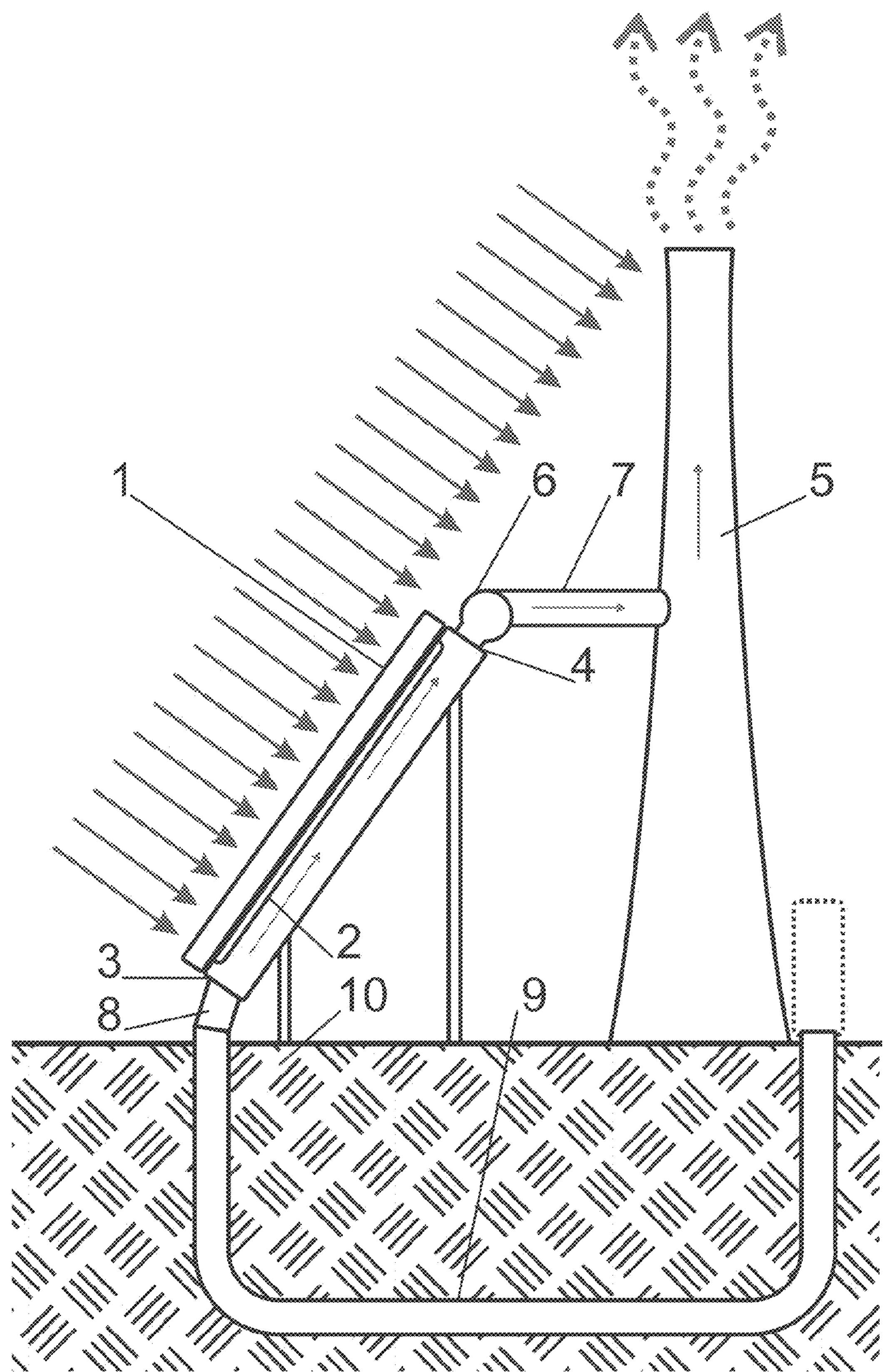

On the FIG. 3, there is a system with one chimney and one ground-coupled heat exchanger air—ground, which is placed sinuously in the ground under the panels. The length of the air exchanger is indicated in a purely illustrative way.

Figure 4:
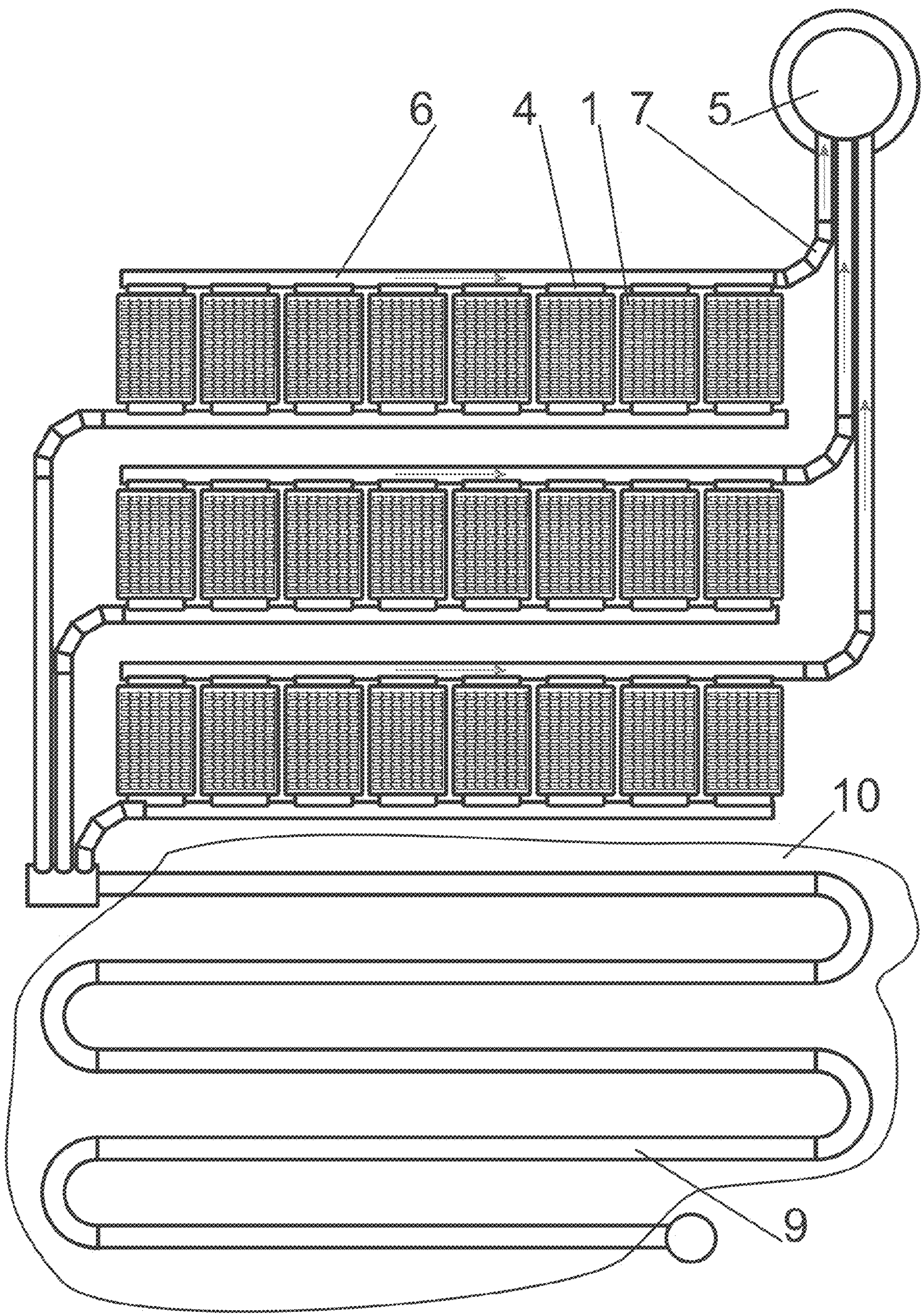

FIG. 4 shows an overhead view of how air coolers are connected to a chimney and to a ground-coupled heat exchanger with a sinuously placed pipework in the ground. The ground is depicted up to the depth in which the ground-coupled heat exchanger is placed.

Figure 5:
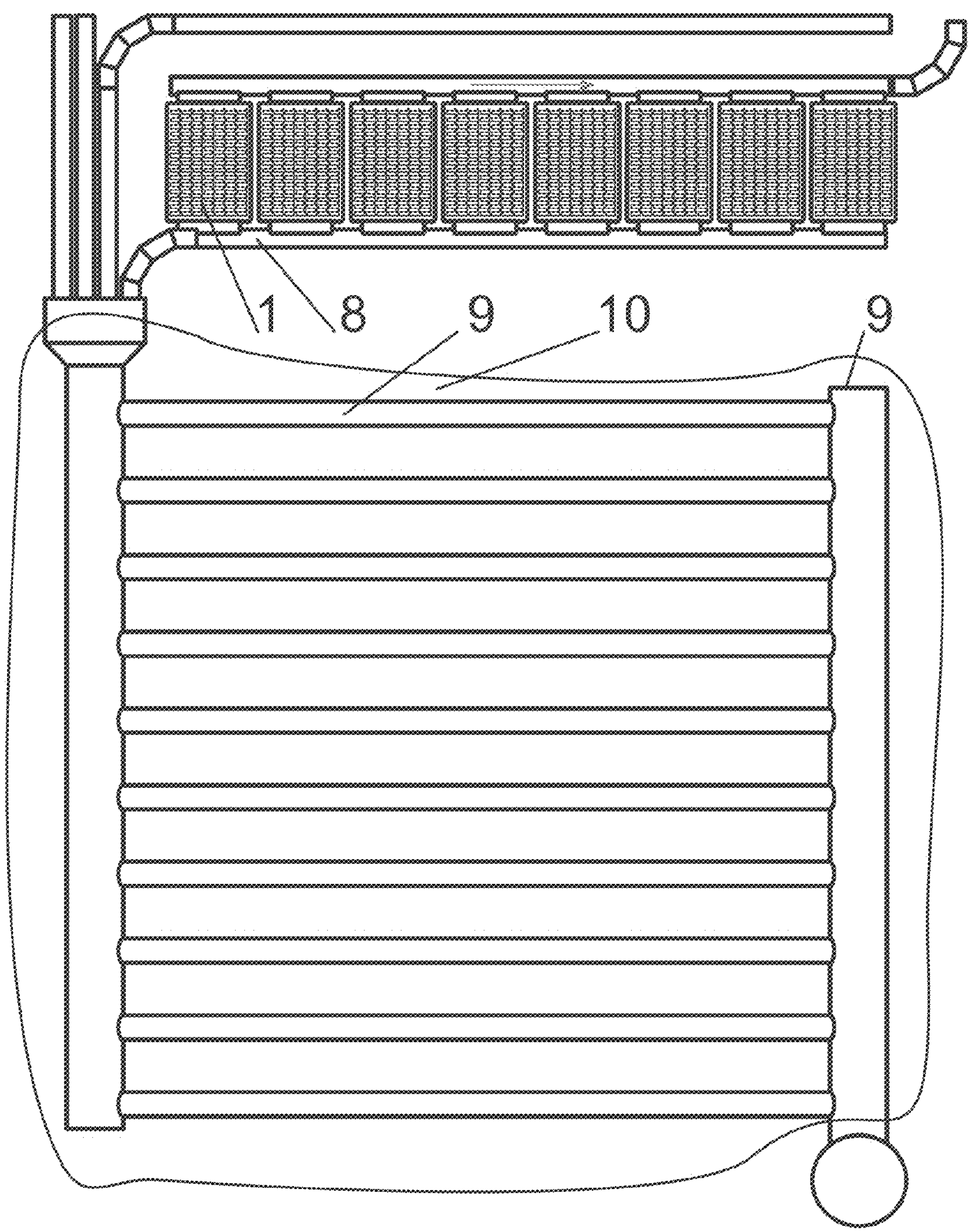

On the FIG. 5, there is a detail view of a ground-coupled heat exchanger with a cross-connected register. The ground is depicted up to the depth in which the ground exchanger is placed.

Figure 6:
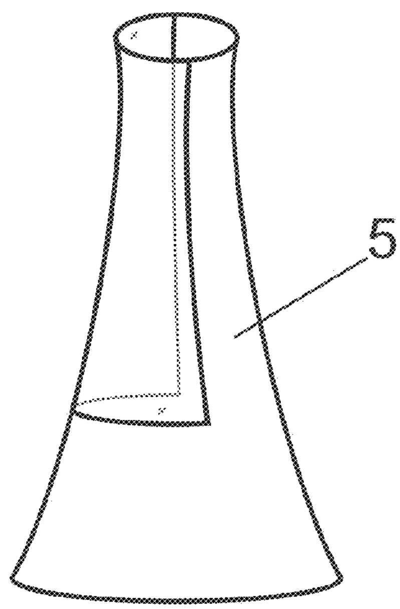

FIG. 6 depicts an example of a chimney with partially transparent surface that is oriented towards the side exposed to the sun.

Figure 7:
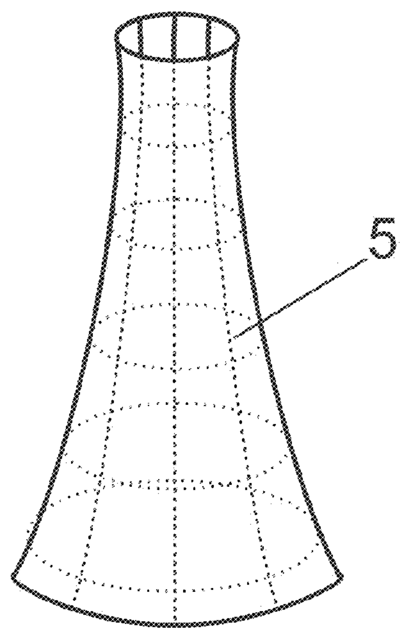
Figure 8:
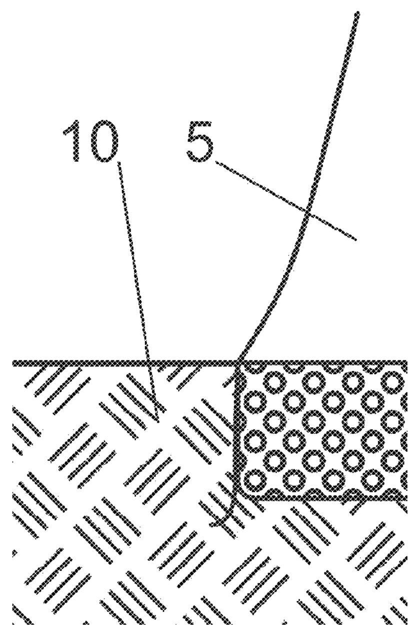

On the FIG. 7, there is a chimney structure having a coating made of canvas; on the FIG. 8, there is a detail of the chimney base in the ground—with gravel layer within the chimney base.

Figure 9:
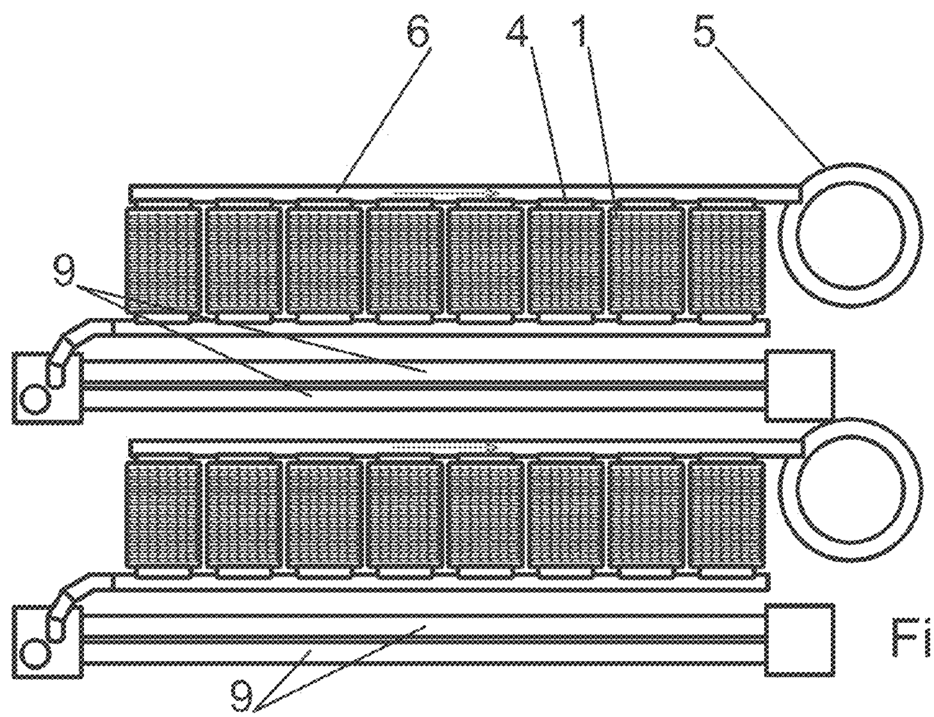

FIG. 9 depicts an overhead view of ground-coupled heat exchanger pipe buried in an alley between panels and it depicts a chimney for one row of panels.

Figure 10:
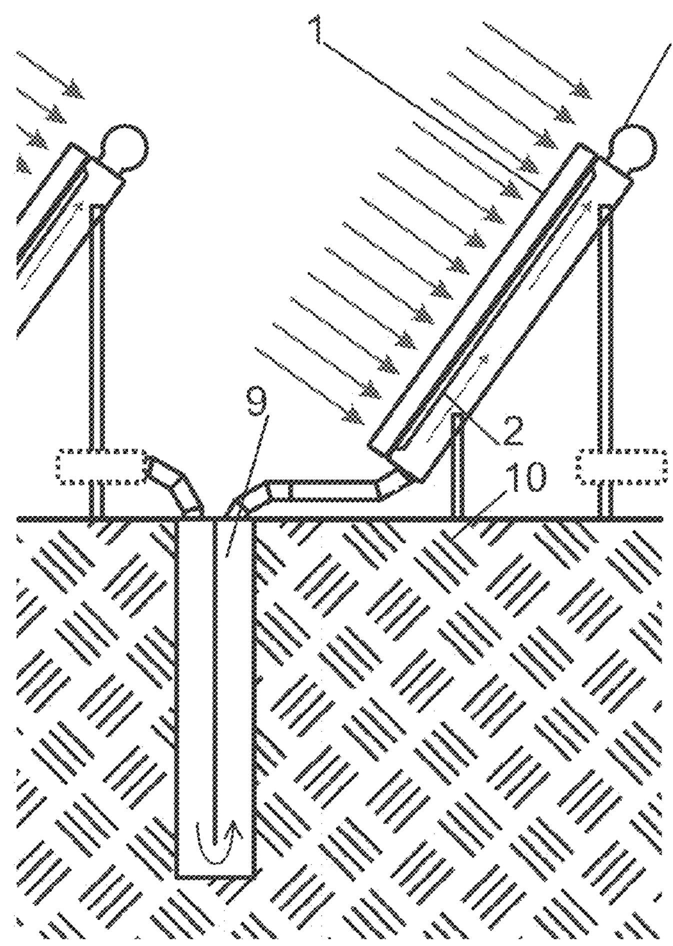

On the FIG. 10 there is a drill well with an air exchanger for one column of panels.

EXAMPLES OF INVENTION IMPLEMENTATIONS

Example 1

Figure 1:
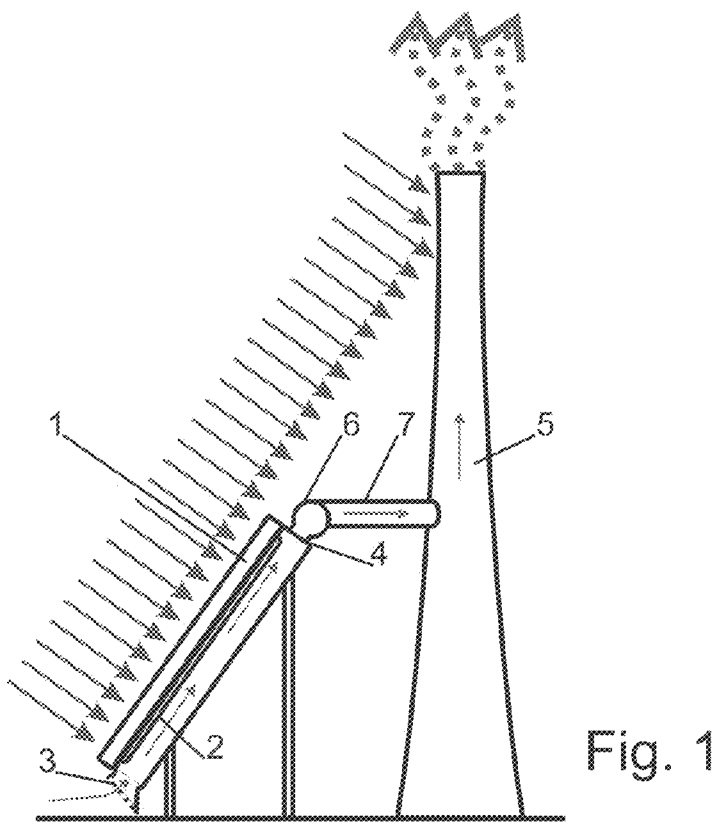
Figure 2:
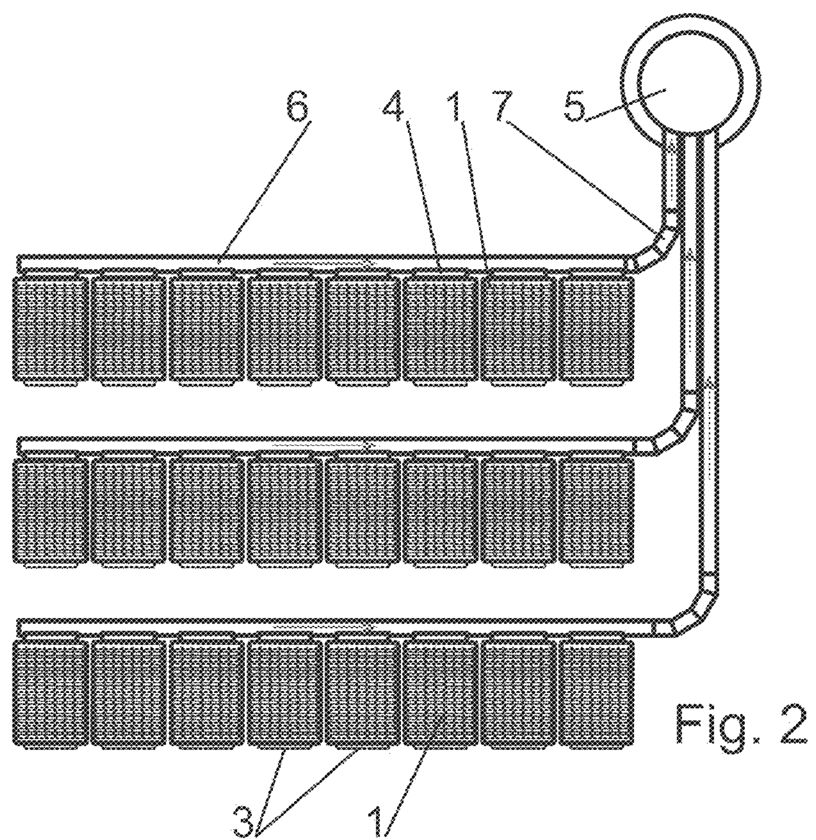
FIG. 2 shows an overhead view of how a chimney is connected to three rows of photovoltaic panels with thermal collectors and warm air piping.

In the example according to the FIGS. 1, 2 and 6, there is a cooling system and method used in a small photovoltaic power plant that has three rows of panels 1 with 8 panels 1 in each row. Each panel 1 encompasses a unit, in which there are air coolers 2. The air coolers 2 are in the form of aluminium grille ribs at the back side of the photovoltaic cells. In the lower part of the unit there is a cooling air intake opening 3, in the upper part at the back there is an air outtake vent 4. The cooling air intake opening 3 is equipped with a mesh net preventing insects from entering the unit.

The unit outtake vent 4 is connected to a joint thermal collector 6 for one row of panels 1. Each of the three collectors 6 is then connected to a chimney 5 using independent and different diameter warm air piping 7. The pipework forming warm air piping 7 of the first and second order is transparent and runs on the eastern side.

A chimney 5 is in the north-eastern corner of the power plant. It is created by roll bending of a galvanized metal sheet, its diameter tapers towards the top and it is paint coated in black from the eastern, southern and western side. On the top of the chimney 5 there is a rotating wind rose.

Example 2

In the example according to the FIGS. 3 and 4, the system described in the previous example is supplemented for a ground-coupled heat exchanger 9 of the air—ground 10 type. The ground-coupled heat exchanger 9 consists of several 6 m long plastic pipes of 400 mm diameter. The pipes are connected using pipe fittings forming a 60 m long route, in which the sucked air is cooled. The cooling air piping 8 connects the intake openings 3 with the ground-coupled heat exchanger 9.

The ground-coupled heat exchanger 9 is under ground 10 under photovoltaic panels 1. It was dug into the ground 10 even before the photovoltaic panels 1 were mounted. The air intake into the ground-coupled heat exchanger 9 is above the ground level on the north side and it is equipped with a replaceable filter.

Example 3

In the example according to the FIG. 5, there is a ground-coupled heat exchanger 9 in the form of a register, in which air flow division are reached and by that even the speed and pressure losses are lowered. In principle, it is possible to use various combinations of ground-coupled heat exchanger 9 installation.

Example 4

In the example according to the FIGS. 7 and 8 there is a chimney 5 created from a UV resistant canvas. The canvas is cut in such a way so that it forms approximately a shape of a circular hyperboloid after it is sewn together and tightened to a frame. The frame is made of vertical bent rods and vertical circles made from rods. The structure can be welded and transported to the installation place in two half-shells. At the installation location of the chimney 5, a circular hole, having parameters of the chimney 5 base, is dug up. The vertical rods are affixed to the ground using ground screws. The lower part of the canvas is dug into the ground by which the chimney unit is sealed up at the base. The circular hole in the chimney 5 is filled up with rough gravel, which creates a dry well for storm water that got into the chimney 5 through rainfall. The canvas is tightened to the frame and the intake of warmed-up air into the chimney 5 is created using a reduction. The canvas can have a dual layer with a thermal insulation layer. A transparent layer, instead of a common canvas, is used in the part with direct exposure to solar radiation.

The usage of a canvas contributes to better visual acceptance of the chimney 5 in the environment. The use of solid chimneys made of standard materials could lead to erroneous impressions by the public concerning the subject matter of the device and subsequently to hostile attitude towards the power plant.

Example 5

The chimney 5 is made out of impregnated fabric that is reinforced by circular loops with escalated diameters. The lower part is affixed to the ground. The chimney 5 encompasses even a vertical structure made out of three columns tilted towards one another. These columns carry pulleys. The upper loop of the chimney 5 coating is pulled up and held in place using cords and pulleys. In this way a chimney that can be easily folded down is created. In case the chimney 5 is shielded by photovoltaic panels especially at the time when the surrounding temperature is lower e.g. early in the morning, the height of the chimney 5 can be changed by lowering cords using an electrically controlled winch. The chimney 5 can be pulled-down even automatically in case the wind strength surpasses preset limits. In that kind of case the cool air flow would be supported by wind roses.

Example 6

In the example according to the FIG. 9, there is a ground-coupled heat exchanger 9 placed in the ground 10 in such a way that one piping with three pipes buried in the alley is intended for cooling of one row of photovoltaic panels 1 with its own chimney 5.

Example 7

In the example according to FIG. 10 a ground-coupled heat exchanger 9 is placed into the ground 10 in such a way so that there is one opening drilled for each column of photovoltaic panels 1 in a given row. A pipe, having a divider dividing intake opening and the outtake vent so that air flows only along the bottom of the pipe, is inserted into this opening.

INDUSTRIAL USABILITY

According to this invention it is possible to industrially and repeatedly create a cooling system that cools the photovoltaic panel unit—with the cooling being driven by natural draft of a chimney. Moreover, the cooling can be enhanced by using ground cooling effect of the layer below the ground level.

LIST OF RELATED TERMINOLOGY

1—photovoltaic panel
2—air cooler
3—intake opening
4—outtake vent
5—chimney
6—thermal collector
7—warm air piping
8—cold air piping
9—ground-coupled heat exchanger
10—ground

The invention claimed is:

1. A photovoltaic panel (1) cooling system, in which a heat is taken away using air that flows next to the photovoltaic panel (1) and/or through the photovoltaic panel (1) and/or along the photovoltaic panel (1), the photovoltaic panel (1) comprising:

an air cooler (2) located within a closed unit that is adjusted for air flow; the closed unit has an air intake opening (3) and an air outtake vent (4), wherein the air outtake vent (4) is connected to a chimney (5) in order to create a natural draft, while at least a part of the chimney (5) is exposed to solar radiation that supports the chimney's (5) natural draft; and the chimney mouth (5) is above the level of the air outtake vent (4).

2. The photovoltaic panel (1) cooling system according to the claim 1, wherein at least a part of the chimney (5) is equipped with a heat-absorbing surface.

3. The photovoltaic panel (1) cooling system according to claim 1, wherein on the side with the solar exposure, the at least part of the chimney (5) coating is transparent and the remaining part of the coating is equipped with a heat-absorbing surface on the inside.

4. The photovoltaic panel (1) cooling system according to claim 1, wherein the at least on the side with the solar exposure, the chimney (5) has a double layer coating; an outer layer that is transparent and a second layer one having a heat-absorbing surface.

5. The photovoltaic panel (1) cooling system according to claim 1, wherein the chimney (5) has a shape of a rotational hyperboloid.

6. The photovoltaic panel (1) cooling system according to claim 1, wherein the chimney (5) has at least one joint in a lower part; the joint is safeguarded by a safety catch and is oriented so that in case of a strong wind, the safety catch is activated and the chimney (5) falls down in a controlled manner outside a zone with the photovoltaic panels (1).

7. The photovoltaic panel (1) cooling system according to claim 1, wherein the chimney (5) has a frame made from rods and a coating made from a bendable layer, the coating is made from canvas or an impregnated fabric, while the shape of the chimney is defined by a frame made from rods.

8. The photovoltaic panel (1) cooling system according to claim 1, wherein the air outtake vents (4) of several photovoltaic panel (1) units lead to one chimney (5), through thermal collectors (6) and a warm air piping (7), the pipework of which is gradiently descending and/or connected in an opposite configuration in order to reach identical air flow in photovoltaic panel (1) units.

9. The photovoltaic panel (1) cooling system according to claim 1, further including a supporting wind device designated to transform a wind energy into the natural draft of the chimney (5); the supporting wind device has a form of a wind turbine head at the chimney (5) mouth.

10. The photovoltaic panel (1) cooling system according to claim 1, the closed unit has the same attachment elements at a rear side as the photovoltaic panel (1), to which the closed unit is itself attached.

11. The photovoltaic panel (1) cooling system according to claim 1, further including an air cooler that is connected with the air intake opening (3) into a branch.

12. The photovoltaic panel (1) cooling system according to the claim 11, wherein the air intake opening (3) is connected to an air cooler using a cooling air piping (8) or a two-way valve, or a by-pass that sucks the air from the photovoltaic panel (1) surrounding environment.

13. The photovoltaic panel (1) cooling system according to claim 11, wherein the air cooler is formed out of a ground-coupled heat exchanger (9) of the air ground (10) type, in which the pipework of the ground-coupled heat exchanger (9) is stored in the ground (10).

14. The photovoltaic panel (1) cooling system according to claim 13, wherein the pipework of the ground-coupled heat exchanger (9) is sinuously placed and/or it encompasses a cross-connected register and the ground-coupled heat exchanger (9) pipework is gradiently descending to the place a condensate drains, preferably to the place where the condensate drains into a dry well.

15. The photovoltaic panel (1) cooling system according to claim 11, wherein the air intake opening (3) and/or intake opening of the ground-coupled heat exchanger (9) includes a replaceable air filter.

16. The photovoltaic panel (1) cooling system according to claim 13, wherein the ground-coupled heat exchanger (9) is equipped with a pressure valve for a disconnection of the ground-couple heat exchanger (9) in case of a low suction pressure.

17. The photovoltaic panel (1) cooling system according to claim 13, wherein the ground-coupled heat exchanger (9) pipework is laid in ground (10) in an alley between photovoltaic panel (1) rows.

18. The photovoltaic panel (1) cooling system according to claim 13, wherein the ground-coupled heat exchanger (9) pipework is laid in ground (10) under photovoltaic panels (1).

19. A method for installing a cooling system comprising the steps of:

installing into a ground a plurality of photovoltaic panels (1) placed in rows, each panel includes an air cooler (2) located within a closed unit that is adjusted for air flow; the closed unit has an air intake opening (3) and an air outtake vent (4), wherein the air outtake vent (4) is connected to a chimney (5) creating a natural draft, while at least a part of the chimney (5) is exposed to solar radiation that supports the chimney's (5) natural draft; and the chimney mouth (5) is above the level of the air outtake vent (4);

digging up at least one groove in the ground (10) in an alley section between adjacent rows of photovoltaic panel (1);

placing at least one pipe on each groove, the pipes are connected to an air cooling ground-coupled heat exchanger (9), also placed into the groove; or drilling a vertical well in the ground (10) in an alley section between adjacent rows of the photovoltaic panel (1) and inserting heat exchanging pipes inside the well into this opening.

20. The method according to claim 19, wherein the pipes of the cooling air ground-coupled heat exchanger (9) are placed into the ground (10) before photovoltaic panels (1) are installed.

21. A method according to claim 19, wherein uses solar radiation to warm up air in the chimney (5); the air ascends up towards the chimney mouth and the chimney (5) natural draft created enables air flow within the photovoltaic panels (1).

22. The method according to claim 21, wherein a cooling air sucked into the photovoltaic panels (1) is being cooled to a temperature that is lower than a surrounding environment temperature, leading the air through a hydronic piping in the ground (10) or in a water source.

* * * * *